United States Patent [19]
Hetterscheid et al.

[11] 3,757,144
[45] Sept. 4, 1973

[54] SWITCHING CIRCUIT TRANSISTOR WITH A DELAYED TURN ON DIODE COUPLED TO ITS EMITTER AND BASE ELECTRODES

[75] Inventors: Wilhelmus Theodorus Hendrikus Hetterscheid; Harry Rimmer De Vries, both of Nijmegen, Netherlands

[73] Assignee: U.S. Philips Corporation, New York, N.Y.

[22] Filed: Jan. 14, 1972

[21] Appl. No.: 217,985

Related U.S. Application Data

[63] Continuation of Ser. No. 26,497, April 8, 1970, abandoned.

[30] Foreign Application Priority Data

Apr. 16, 1969 Netherlands ........................ 6905824

[52] U.S. Cl. .................. 307/300, 307/268, 307/280, 315/27 TD
[51] Int. Cl. .............................................. H03k 3/26
[58] Field of Search .................... 307/228, 268, 270, 307/280, 300; 315/27 TD

[56] References Cited

UNITED STATES PATENTS

| | | | |
|---|---|---|---|
| 2,924,744 | 2/1960 | Paynter | 307/228 X |
| 3,015,741 | 1/1962 | Richards | 307/228 |
| 3,204,145 | 8/1965 | Schneider | 315/27 TD |

*Primary Examiner*—Stanley D. Miller, Jr.
*Attorney*—Frank R. Trifari

[57] ABSTRACT

A switching circuit has a first transistor and a transformer which apply a switching signal to a second transistor. A long turn on time diode is connected to the second transistor base and emitter electrodes, but in an opposite conductivity direction, to prevent excessive power dissipation during the switching off period. A second diode can be connected between the transformer and the emitter to prevent loading of the transformer. Likewise, a coil can be connected between the transformer and the base to improve turn off performance.

10 Claims, 2 Drawing Figures

Figure 1:
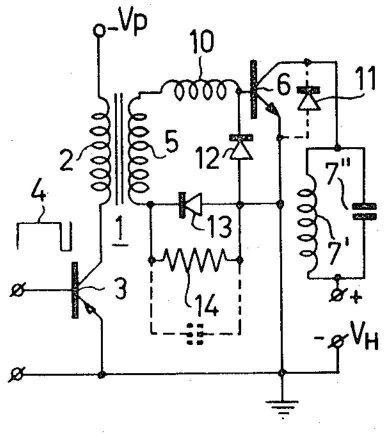

INVENTORS
WILHELMUS T. H. HETTERSCHEID
HARRY R. DE VRIES
BY
AGENT

INVENTORS
WILHELMUS T. H. HETTERSCHEID
HARRY R. DE VRIES
BY
AGENT

SWITCHING CIRCUIT TRANSISTOR WITH A DELAYED TURN ON DIODE COUPLED TO ITS EMITTER AND BASE ELECTRODES

This is a continuation of application Ser. No. 26,497, filed Apr. 8, 1970, now abandoned.

The invention relates to a circuit arrangement including high voltage transistor, particularly a power transistor, drive means which provide a pulsatory switching signal between base and emitter electrodes of the transistor, and a load impedance connected to the collector electrode of the transistor, the collector current of the saturated transistor provided by a voltage source being interrupted under the influence of the pulsatory switching signal applied to the transistor, while for increasing the mean derivative with respect to time of the collector current during the switching-off of the collector current the drive means are on the one hand connected directly to the emitter electrode and on the other hand to the base electrode of the transistor through an impedance limiting the variation during the switching-off of the base current of the transistor which impedance is formed as a coil, all this in accordance with the U.S. patent application Ser. No. 737,009 filed on June 14, 1968.

It appears therefrom that the base current shows a delayed variation after the occurrence of the trailing edge of the driving switching signal. As a result it is achieved that the excessive number of charge carriers present in the transistor is removed. However, after the instant when the excessive number of charge carriers is removed the voltage across the emitter-base junction of the transistor has a greater negative value under the influence of the coil than that which corresponds to the switching voltage provided by the drive means. In fact, due to stepping up, this emitter-base voltage reaches the breakdown voltage of the base-emitter diode and maintains this voltage value as long as a base current continues to flow, through to a decreasing extent through the coil. Thus the power dissipated in the base of the transistor assumes quite a considerable value, which may be considered a pure loss and which may be inadmissibly high in some transistor types. An object of the present invention is to reduce this dissipation, and the improvement consists in that a diode having an appreciable turn on time is provided between base and emitter electrodes of the transistor, the conducting direction of said diode being opposite to that of the base-emitter junction of the transistor and causing a delay time of not less than 1 $\mu$s and not more than 2 $\mu$s.

It is to be noted that it is known from U.S. Pat. No. 2,924,744 to arrange a diode between the base and emitter electrodes of the transistor. However, the object of this diode is to reduce the impedance of the source driving the transistor, and to this end, the diode must be capable of quickly following the variations in the voltage supplied by the source.

Figure 2:
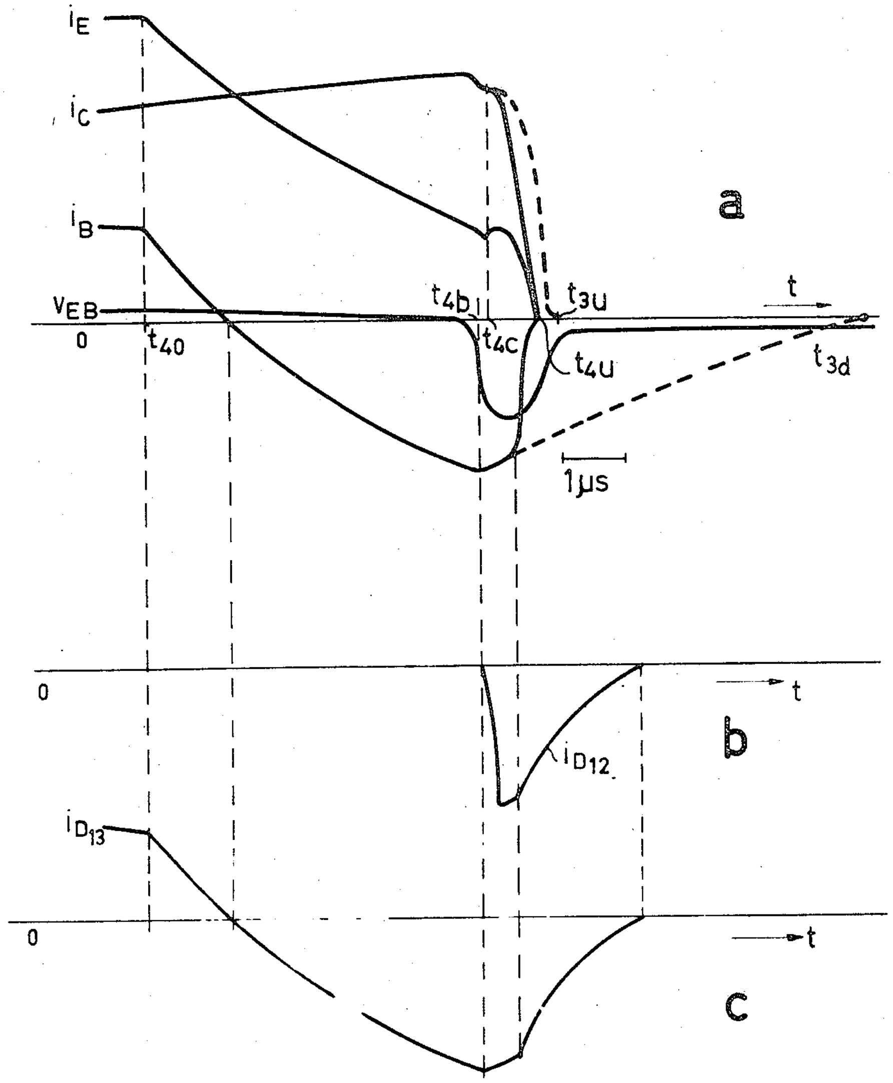

In order that the invention may be readily carried into effect, a few embodiments thereof will now be described in detail by way of example with reference to the accompanying diagrammatic drawings, in which FIG. 1 shows an embodiment of the circuit arrangement according to the invention, and FIG. 2 shows the associated current and voltage characteristics.

FIG. 1 shows a circuit arrangement according to the invention, and FIG. 2 shows the associated curves representing currents and a voltage. A primary winding 2 of a transformer 1 is connected at one end to the collector electrode of a pnp-transistor 3, and at the other end to a terminal conveying a potential $-V_p$ of a voltage source, not shown, whose other terminal is connected to ground. The emitter electrode of transistor 3 is connected to ground while a pulsatory voltage 4 is applied to the base. One end of secondary winding 5 of transformer 1 is connected through a coil 10 to the base electrode of a high voltage and/or power transistor 6 of the npn-type. The emitter electrode of transistor 6 is connected to ground while the collector electrode is connected through a load impedance 7 to a terminal conveying a positive potential of a voltage source $V_H$ of, for example, 220 Volts, the other terminal being connected to ground.

A diode 12, whose conducting direction is opposite to that of the base-emitter diode of transistor 6 is arranged between base and emitter electrodes of transistor 6 according to the principle of the present invention. In the embodiment of FIG. 1 the cathode of diode 12 is therefore connected to the base electrode and its anode is connected to the emitter electrode of transistor 6. As will further explained, diode 12 should be a diode having an appreciable turn of time. The other end of secondary winding 5 is connected to the emitter electrode of transistor 6 through a second diode 13 which is shunted by a resistor 14. In the embodiment of FIG. 1, the cathode of diode 13 is connected to the said end of winding 5, while its anode is connected to the junction of diode 12 and the emitter electrode of transistor 6.

Transformer 1 and transistor 3 constitute drive means (1,3) for driving transistor 6. Pulsatory voltage 4 should be applied to coil 10 with as little distortion as possible to which end transformer 1 is formed in such a manner that the leakage inductance thereof is negligibly small. The desired shape of the pulsatory voltage 4 is generally dependent on the purpose for which the circuit arrangement of FIG. 1 is used and to which the construction of load impedance 7 is adapted. For television purposes where the circuit arrangement can be used for generating a sawtooth voltage by line deflection coils forming part of impedance 7, pulsatory voltage 4 can be generated at the line frequency by an oscillator. Since all this is of minor importance for the explanation of the invention, which has for its object the very quick switching-off of the collector current of a saturated high voltage and/or power transistor, it is left outside consideration in this known circuit arrangement in which manner load impedance 7 is formed.

Drive means (1,3) pass on pulsatory voltage 4 to the base electrode of transistor 6 which should be brought into its cut-off condition by the trailing edge of the voltage 4. FIG. 2 is drawn for illustration of the phenomena which occur in the circuit arrangement according to the invention.

In FIG. 2*a*, the currents $i_E$, $i_C$ and $i_B$ which flow in the emitter, collector and base electrode, respectively of transistor 6, are plotted as a function of time. The same has been done for the voltage $v_{EB}$ across the emitter-base junction. The trailing edge of the pulsatory switching signal between base and emitter electrodes is considered to occur at the instant $t_{40}$. It is apparent from FIG. 2*a* that after the occurrence of the trailing edge of the signal 4 at the instant $t_{40}$ the variation with respect to time of the base current $i_B$ flowing through coil 10 is limited. At the instant $t_{4b}$ the current $i_B$ reaches the maximum negative value and, as is apparent from curve $v_{EB}$, it is to bring the emitter-base junction to its cut-off condition. The reduction of collector current $t_C$ commences at the instant $t_{4c}$.

After the instant $t_{4b}$ when the excessive number of charge carriers has been removed from transistor 6, voltage $v_{EB}$ has a greater negative value under the influence of coil 10 than that which corresponds to the voltage generated by the secondary winding 5. In fact, due to stepping up at the instant $t_{4b}$ voltage $v_{EB}$ reaches the breakdown voltage of the base-emitter diode of transistor 6 and would maintain this voltage value during the period of the base current $i_B$ flowing through coil 10 to a decreasing extent after the instant $t_{4b}$ if diode 12 were not incorporated in the circuit arrangement.

Diode 12 must have a turn on time delay which is understood to mean that the diode reacts in a delayed manner to a voltage which is applied across its terminals in the conducting direction, namely at a period lying between given limits, in the relevant case between approximately 1 and 2 $\mu$s. Without the use of diode 12, voltage $v_{EB}$ would maintain the breakdown voltage of approximately 8V while the (delayed) base current $i_B$ would continue to flow between the instants $t_{4b}$ and $t_{3d}$. As already stated this would cause quite a considerable dissipation in the base-emitter space of transistor 6. In some types of transistors this dissipation may be in the order of approximately 4W. This dissipation is to be considered a pure loss and in addition it is inadmissibly high in some transistor types, so that damage of the transistor would occur. Voltage $v_{EB}$ must, however, assume the said negative value at least over a given period in order that the excessive number of charge carriers present in transistor 6 is removed. This object is achieved due to the presence of diode 12.

Since diode 12 is slow it cannot follow the sudden variation of voltage $v_{EB}$ with the result that this voltage actually becomes highly negative. However, after approximately 1 $\mu$s diode 12 becomes conducting so that the voltage thereacross becomes many times lower, namely in the order of 0.7 V. As a result a considerable energy is saved from being dissipated in the emitter-base region of transistor 6.

At the instant of diode 12 having become conducting, base current $i_B$ of transistor 6 is brought to zero with the result that the emitter and collector currents $i_E$ and $i_C$ also become zero. In fact, transistor 6 is no longer saturated so that base current $i_B$ may exert influence on $i_E$ and $i_C$. This means that the switch-off period between $t_{4c}$ and $t_{4u}$ is slightly shortened relative to the case without a slow diode ($t_{3d}$, $t_{4u}$) which may be considered an additional advantage of the present invention.

Diode 13 is arranged in the circuit arrangement so as to prevent a great current from flowing from approximately the instant $t_{4b}$ in the closed circuit constituted by winding 5, coil 10 and diode 12 during the conducting period of diode 12, which current would correspond to a great power which would have to be provided by drive means (1,3).

When switching signal 4 is positive, in which condition the base-emitter diode of transistor 6 conducts, diode 13 conducts and thus constitutes a direct connection between secondary winding 5 and the emitter electrode of transistor 6. At the instant when the base current $i_B$ starts to become zero, its task is taken over by the current $i_{D12}$ (FIG. 2b) flowing through diode 12. Diode 13 should have a comparatively long recovery time in the reverse direction in order that the energy stored in coil 10 can flow through it from the instant when base current $i_B$ is negative. This recovery time then determines the slope of currents $i_{D12}$ (FIG. 2b) and $i_{D13}$ (FIG. 2c), which flows through diode 13. Diode 13 does not disturb the envisaged operation of the circuit arrangement and only prevents the above-mentioned load of drive means (1,3).

If the load impedance 7 is mainly inductive a high voltage peak is produced at the collector electrode of transistor 6 so that a leakage current can flow in the base-collector diode. To give this leakage current a low resistive path a resistor 14 is connected parallel to diode 13 or to diode 12 which is active as from the instant when base current $i_B$ is negative up till the instant when diode 12 starts to conduct. A practical value therefor lies between 10 and 100 ohms. As a result of the presence of resistor 14 if parallel to diode 13 a greater current flows through diode 12 than that shown in FIG. 2b. If the recovery time of diode 13 is too short an improvement can be obtained by shunting this diode by means of a capacitor of 0.1 to 2 $\mu$F.

FIG. 1 shows a more detailed circuit arrangement for generating a sawtooth current through line deflection coils of a television display device not shown. To this end load impedance 7 is split up into a line deflection coil 7′ optionally comprising a plurality of partial coils and a parallel-arranged capacitor 7″. Both components constitute in known manner a resonant circuit which is connected when the collector current $i_C$ is switched off. A so-called efficiency diode 11 may be arranged between emitter and collector electrodes of transistor 6. To obtain the advantages of the known efficiency circuit it is alternatively possible to utilize the base-collector diode of transistor 6. This is more fully disclosed in U.S. Pat. No. 3,504,224. At the instant when the base-collector diode becomes conducting at the commencement of the stroke and thus functions as an efficiency diode as a result of the fact that a current then flows from load impedance 7, diode 13 remains blocked while diode 12 functions substantially as a short circuit. Without diode 12 the negative voltage present on the base of transistor 6 would be increased by the voltage across the base-collector diode, namely approximately 0.8 V. When using diode 12 the additional power caused thereby is, however, partially taken over by the diode. In this connection it is to be noted that the two diodes 12 and 13 are low-voltage diodes which in addition may be suitable for small powers while an efficiency diode 11 must be able to stand high voltages and pass high currents.

It will be evident that the construction of the drive means (1,3) is of minor importance for the principle of the present invention. The same applies to the construction of the circuit arrangement with transistors 3 and/or 6 being of a conductivity type opposite to the type shown in the Figures. It is likewise irrelevant whether the emitter or the base electrode of transistor 6 in the circuit arrangement is formed as a common electrode.

What is claimed is:

1. A circuit comprising a transistor having emitter, base, and collector electrodes said base and emitter electrodes thereby defining a base-emitter junction having a conducting direction through said junction; a load impedance coupled to said collector; means for applying a switching signal to said base and emitter electrodes, whereby said transistor has alternate on and off periods; and means for preventing excessive power dissipation in the base-emitter junction of said transistor during switching from said on to said off periods including a diode having a turn on time greater than one microsecond coupled across said base and emitter electrodes in a conducting direction opposite to that of said conducting direction of the base-emitter junction.

2. A circuit as claimed in claim 1 further comprising a second diode coupled between said applying means and said emitter.

3. A circuit as claimed in claim 2 further comprising a resistor shunt coupled to said second diode.

4. A circuit as claimed in claim 1 further comprising a diode coupled to said emitter and collector electrodes.

5. A circuit as claimed in claim 1 further comprising a coil coupled between said applying means and said base.

6. A circuit as claimed in claim 1 wherein said turn on time is less than two microseconds.

7. A circuit as claimed in claim 1 wherein said transistor is a high voltage type.

8. A circuit as claimed in claim 1 wherein said load impedance comprises a television line frequency deflection coil.

9. A circuit as claimed in claim 1 wherein said emitter is a common electrode with respect to said applying means and said load impedance.

10. A circuit as claimed in claim 1 wherein said applying means comprises a second transistor having emitter, base and collector electrodes, said base being coupled to receive said switching signal; and a transformer having a primary coupled to said collector and emitter electrodes and a secondary coupled to said first transistor base and emitter electrodes.

* * * * *